(12) United States Patent
Chih

(10) Patent No.: US 6,570,797 B1
(45) Date of Patent: May 27, 2003

(54) DESIGN FOR TEST TO EMULATE A READ WITH WORSE CASE TEST PATTERN

(75) Inventor: Yue-Der Chih, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/140,646

(22) Filed: May 7, 2002

(51) Int. Cl.[7] ............................. G11C 7/00; G11C 16/06
(52) U.S. Cl. .................................. 365/201; 365/185.09
(58) Field of Search ..................... 365/185.09, 185.21, 365/201

(56) References Cited

U.S. PATENT DOCUMENTS

| | | | |
|---|---|---|---|
| 5,587,946 A | * 12/1996 | Campardo et al. | 365/185.02 |
| 5,717,652 A | 2/1998 | Ooishi | 365/233 |
| 5,784,314 A | 7/1998 | Sali et al. | 365/185.2 |
| 6,243,313 B1 | * 6/2001 | Sakamoto et al. | 365/207 |
| 6,262,927 B1 | 7/2001 | Beigel et al. | 365/201 |

* cited by examiner

Primary Examiner—Son Mai
(74) Attorney, Agent, or Firm—George O. Saile; Stephen B. Ackerman

(57) ABSTRACT

In the present invention a read test is performed on a selected cell. During the read test, a high impedance is connected to the bit lines of unselected memory cells which are connected to a common source line with the selected cell. The high impedance is created by a tri-state buffer that has a test mode control, and prevents leakage current from flowing from the common source line through unselected, erased cells. The inhibiting of the leakage current permits improved test margins to be applied to the reading of a selected cell.

16 Claims, 2 Drawing Sheets

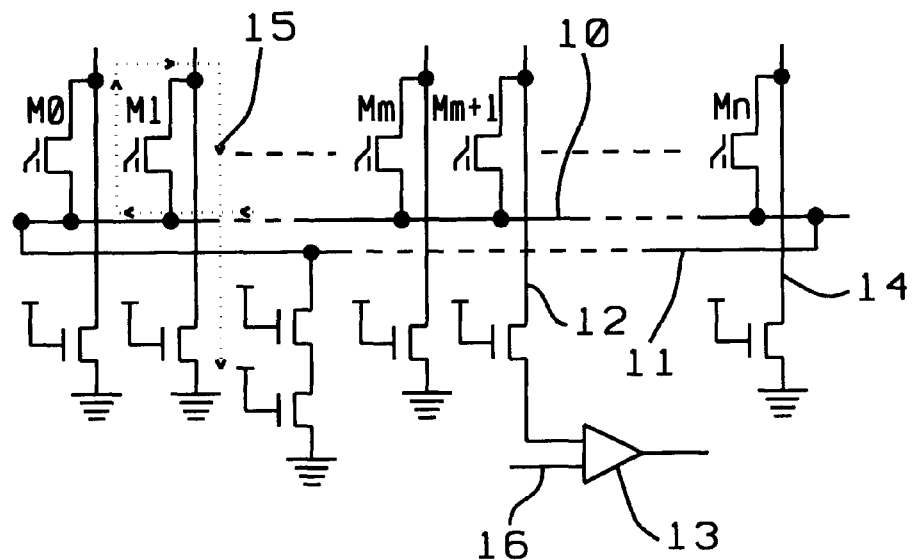
*FIG. 1 — Prior Art*
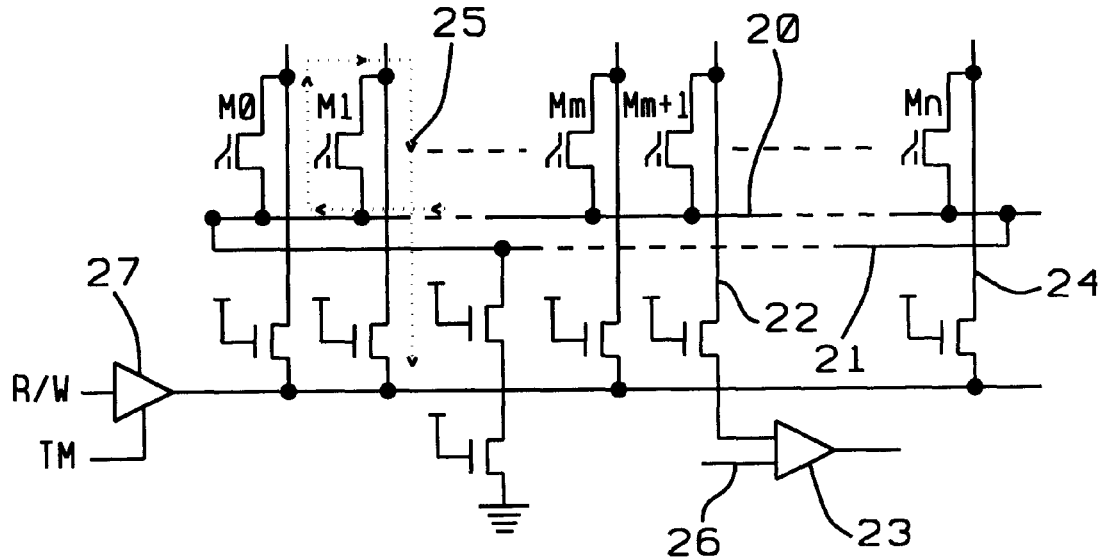
*FIG. 2*

|  | Inactive | Active |
|---|---|---|
| Sense Amplifier | Not Enabled | Enabled |
| Tri-State Buffer Output | Ground | Hi Z |

*FIG. 3*

DESIGN FOR TEST TO EMULATE A READ WITH WORSE CASE TEST PATTERN

BACKGROUND OF THE INVENTION

1. Field of Invention.

The present invention relates to semiconductor memory and in particular performing a read test on a nonvolatile memory cell.

2. Description of Related Art.

During a read operation of a nonvolatile EEPROM flash memory cell, the cell current will flow through two paths to ground. One path is through the source driver and the second path is through unselected erased cells. The second path is called herein a parasitic conduction path. The reference level of the memory sense amplifier circuit is dependent on the conductivity of the path from the source line to ground of a selected row of memory cells. Therefore, the more erased cells in the selected row, the higher the conductivity from the source line to ground. This is caused by the erased cells being on and providing a second path for the selected cell current to reach ground. The reference level of the memory sense amplifier will, therefore, be dependent upon the data pattern of the unselected cells on a selected word line during a read operation.

U.S. Pat. No. 5,717,652 (Ooishi) is directed to the testing time of a semiconductor memory device using a test mode to activate internal time period settings. In U.S. Pat. No. 5,784,314 (Sali et al.) a method is directed to setting the threshold voltage of a reference memory cell. U.S. Pat. No. 6,262,927B1 (Beigel et al.) is directed to a read test for a current saturation test device.

In FIG. 1 is shown a portion of a flash memory array of prior art where memory cells M0, M1, Mm, Mm+1 and Mn are connected together with the same source line 10. The source line 10 has a resistivity of approximately one hundred ohms per cell and is strapped with a metal source line 11, which has a resistivity of approximately zero ohms per cell. A selected bit line 12 is connected to a sense amplifier 13, where the memory cell Mm+1 is the selected cell. Cells M0, M1, Mm and Mn represent unselected cells that are connected to the source line 10. The bit lines connected to the unselected cells, as represented by 14, are connected to ground. When an unselected cell, such as cell M1, is in an erased state, the cell transistor is on and can provide a leakage path 15 for current to flow from the source of the selected cell to ground. Other cells connected to the common source line can also be in an erased state, providing additional leakage paths for the cell current to flow to ground. This requires the reference level 16 of the sense amplifier 13 to be set differently depending on the conductivity of the path from the source line to ground. Since the state of the unselected cells is hard to control for test purposes, testing a read operation to within satisfactory margins is difficult to do; and therefore, a test margin in chip production (CP) test is small.

To overcome problems test margin during CP test in the prior art a whole chip is first erased and then a memory cell is read to verify the erasure. Since all the cells on a word line are in an erase state, the conductivity of the source line to ground is high as a result of the large number of parasitic conduction paths through the erased unselected memory cells. The sense amplifier reference level is 'set lower as a result of the high conductivity of the source line to ground, which results in a lower test margin being guaranteed by the chip production test. To correct this problem a method is needed that produces a worse case condition so that adequate test margins can be established for a read test.

SUMMARY OF THE INVENTION

It is an objective of the present invention to establish a high effective impedance for each of the unselected memory cells between a bit line and a source line common with a memory cell being read.

It is also an objective of the present invention establish the high effective impedance of unselected memory cells between bit lines and a source line common with a memory cell being read regardless of the erase state of each unselected memory cell.

It is further an objective of the present invention to connect to a buffer amplifier the bit lines of unselected memory cells common to a source line and set the output of the buffer amplifier to high impedance when a memory cell connected to the source line is measured by a read operation.

It is still further an objective of the present invention that the buffer amplifier connected to bit lines have an output that is ground for normal read operations, a high impedance state to emulate a worse case impedance for test and a voltage Vcc for programming.

In the present invention bit lines of unselected cells of a flash memory that are connected to a common source line with a selected cell are connected to a tri-state buffer during a test read operation. When the tri-state buffer is used in a test read operation all unselected bit lines are connected to a high impedance which emulates all unselected cells being programmed and in an "off" state. This provides a worse case condition with which to read a selected cell with proper voltage margins to guarantee the read operation of the memory. Besides the high impedance output state for a test read, the tri-state buffer provides an output that is ground for normal read operations and a voltage Vcc for a programming operation.

The present invention provides a defined configuration to read test any memory array where unselected array bit are connected to ground through a source line. These memory arrays include flash, EEPROM, ROM and other nonvolatile arrays. A source line is usually a diffusion within a semiconductor substrate resulting in approximately one hundred ohms per cell that may be strapped with a metal line that is approximately zero ohms per cell. The strap is not physically connected to the diffused source line at every cell location and as a result in the prior art there is a voltage drop developed along the diffused source line depending upon the number of cells that are erased, or in an on state. This voltage drop in the prior art is a result of total current flowing in the source line from selected cells.

Effective cell current is dependent on source line voltage. The effective cell current is larger if the source line voltage is lower. During CP test all cells in the selected row are in an erase state, and the parasitic conduction path from the source line to ground will cause a lower source line voltage. However, not all cells are in an erase state in a real application. Therefore, the CP test will not be a worse case condition and less test margin will be guaranteed by the CP test.

The voltage on the source line is equal to the product of the total current $I_T$ of the selected cells and the resistance from the source line to ground $R_T$. The resistance $R_T$ is the parallel combination of the on resistance of the source line driver $R_S$ and the resistance of the conduction path through all the erased cells $R_C$. If all the cells on a source line are erased, then $R_C$ is the smallest and $R_T$ is also the smallest.

This results in the source line being the smallest, which is a best test condition. In the present invention the path through the erased unselected cells is controlled off by a tri-state buffer. The tri-state buffer provides a very large impedance, which allows $R_T$ to be approximately equal to $R_S$ and produces a worse case condition.

BRIEF DESCRIPTION OF THE DRAWINGS

This invention will be described with reference to the accompanying drawings, wherein:

FIG. 1 is a diagram of a portion of a flash memory of prior art,

FIG. 2 is a diagram of a portion of a flash memory of the present invention, and FIG. 3 is a table showing the state relationship of the sense amplifier and the tri-state buffer of the present invention.

DETAILED DESCRIPTION OF THE PREFERRED EMBODIMENT

In FIG. 2 is shown a portion of a flash memory array of the present invention. Nonvolatile memory cells M0, M1, Mm, Mm+1, and Mn are connected to a common diffused source line 20. A metal strap 21 is connected across the diffused source line 20 to improve conductivity and is connected at points along the length of the diffused source line 20. The metal strap is connected to ground through bias transistors providing a path for source current. A selected bit line 22 is connected to cell Mm+1, which is to be read by the sense amplifier 23 to a reference voltage 26.

The unselected bit lines, such as bit line 24, are connected to an output of a tri-state buffer 27. The tri-state buffer is set for a read operation "R", or a write operation "W" by the R/W input. A test mode control line "TM" controls the output of the tri-state buffer to be at a high impedance during a test of the read operation applied to the selected bit line 22 and memory cell Mm+1. The high impedance output of the tri-state buffer prevents leakage current 25 from flowing through unselected and erased memory cells, such as memory cell M1.

By preventing leakage current 25 from flowing through erased and unselected cells, M1, an improved reference voltage 26 to the sense amplifier can be established. This improved reference voltage is possible because there is no leakage current flowing that can introduce an incremental voltage change $\Delta V_{SL}$ in the source line that would necessitate a change in the sense amplifier reference voltage 26. If $\Delta V_{SL}$ were a constant then the reference voltage for the read test could be compensated without affecting the test margins, but since the number and location of erased unselected bit lines connected to a source line are not easily definable, the $\Delta V_{SL}$ is a variable that affects the read test margins. For each unselected memory cell that has been erased, a path to ground as shown in FIG. 1 of the prior art lowers the source line voltage, changing the current flow through the selected cell and requiring an adjustment in the sense amplifier 23 reference voltage 26.

The selection of a high impedance output in the tri-state buffer 27 during a test read by the sense amplifier 23 of a selected cell Mm+1 blocks all leakage current through erased and unselected cells, such as Mn connected to bit line 24, and emulates a worse case impedance, $R_{max}$, Where $R_{max}$ is the programmed, or "off", impedance of the transistors Mn.

In FIG. 3 is shown a table of the states of the sense amplifier 23 and the tri-state buffer 27 for a test mode where a memory cell Mm+1 is read with respect to a reference voltage 26 that has been set with test margins to guarantee a particular cell threshold voltage has been established. When the test mode TM is inactive, the sense amplifier 23 is not enabled and the output of tri-state buffer 27 is at ground. When the test mode TM is activated, the sense amplifier 23 is enabled with a predetermined reference voltage 26 and the output of the tri-state buffer 27 is at a high impedance.

While the invention has been particularly shown and described with reference to preferred embodiments thereof, it will be understood by those skilled in the art that various changes in form and details may be made without departing from the spirit and scope of the invention.

What is claimed is:

1. A memory circuit to emulate the testing of a read operation with a worse case data pattern, comprising:

a) a memory containing a row of a plurality of memory cells, b) a source line connecting together sources of said plurality of memory cells, c) a first bit line connected to a sense amplifier and coupled to a first drain of a first memory cell of said plurality of memory cells, d) a second bit line connected to an output of a tri-state buffer and coupled to a second drain of a second memory cell of said plurality of memory cells, e) said tri-state buffer output set to a high impedance state while reading said first bit line during test mode.

2. The memory of claim 1, wherein said memory is a nonvolatile, EEPROM flash memory.

3. The memory circuit of claim 1, further comprising a plurality of bit lines similarly connected as said second bit line and connected to said plurality of memory cells which are coupled to said output of the tri-state buffer that is set to a high impedance state while said first bit line is read during test mode.

4. The memory circuit of claim 3, wherein the high impedance state of said tri-state buffer emulates a worse case condition where said plurality of memory cells are in an off state resulting in a high impedance.

5. The memory circuit of claim 3, wherein said plurality of memory cells when in an erased state are turned on and provide a parasitic leakage path for source current.

6. The memory circuit of claim 5, wherein said tri-state buffer set to a high impedance state during said test mode read operation inhibits said parasitic leakage current and emulates a condition where said plurality of memory cells are in a programmed state and thereby turned off.

7. A method for creating a maximum impedance condition for unselected memory cells in a read operation during test, comprising:

a) selecting a word line connected to a plurality of memory cells that are coupled to a common source line, a) selecting a memory cell to be read within said plurality of memory cells, b) connecting a sense amplifier to bit line of said memory cell to be read, c) connecting an output of a tri-state buffer to bit lines of unselected memory cells within said plurality of memory cells, d) setting the output of said tri-state buffer to a high impedance state.

8. The method of claim 7, wherein said memory cells are nonvolatile, EEPROM flash memory cells.

9. The method of claim 7, wherein setting the output of said tri-state buffer to a high impedance state inhibits parasitic current flow through unselected memory cells within said plurality of memory cells.

10. The method of claim 9, wherein setting the output of said tri-state buffer to said high impedance state creates a worse case impedance condition for the read of the selected memory cell.

11. The method of claim 10, wherein said worse case impedance condition emulates a condition where all of said plurality of memory cells connected to said word line are programmed and in an off state.

12. A test circuit to emulate a worse case read of a memory cell, comprising:
   a) a sense amplifier means to read a selected memory cell,
   b) a buffer means to bias bit lines connected to unselected memory cells,
   c) a high impedance means produced by said buffer during a read of said selected memory cell.

13. The circuit of claim 12, wherein said selected memory cell and said unselected memory cells share a common word line and a common source line.

14. The circuit of claim 12, wherein said high impedance means emulates a worst case condition where all unselected cells are programmed and in an off state.

15. The circuit of claim 12, wherein said buffer means is a tri-state buffer that is controlled to have an output that is array ground for normal read, a voltage bias for write and said high impedance for a test mode for said read of a memory cell.

16. The circuit of claim 12, wherein said memory cell is a nonvolatile, EEPROM flash memory cell.

* * * * *